United States Patent
Banine et al.

(10) Patent No.: US 7,800,079 B2
(45) Date of Patent: Sep. 21, 2010

(54) ASSEMBLY FOR DETECTION OF RADIATION FLUX AND CONTAMINATION OF AN OPTICAL COMPONENT, LITHOGRAPHIC APPARATUS INCLUDING SUCH AN ASSEMBLY AND DEVICE MANUFACTURING METHOD

(75) Inventors: Vadim Yevgenyevich Banine, Helmond (NL); Levinus Pieter Bakker, Helmond (NL); Johannes Hubertus Josephina Moors, Helmond (NL); Lucas Henricus Johannes Stevens, Eindhoven (NL); Yurii Victorvitch Sidelnikov, Troitsk (RU); Marcel Mathijs Theodore Marie Dierichs, Venlo (NL); Marius Ravensbergen, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 1319 days.

(21) Appl. No.: 10/740,829

(22) Filed: Dec. 22, 2003

(65) Prior Publication Data
US 2005/0133727 A1 Jun. 23, 2005

(51) Int. Cl.
*G21G 5/00* (2006.01)
(52) U.S. Cl. .............. 250/492.2; 250/397; 378/113
(58) Field of Classification Search ............ 250/492.2, 250/492.1
See application file for complete search history.

(56) References Cited
U.S. PATENT DOCUMENTS

| 3,941,996 A | * | 3/1976 | Stauffer | 250/201.7 |
|---|---|---|---|---|
| 3,941,998 A | * | 3/1976 | Merkelo | 250/207 |
| 4,556,875 A | * | 12/1985 | Ishiwatari | 340/679 |
| 5,171,965 A | * | 12/1992 | Suzuki et al. | 219/121.6 |
| 5,252,831 A | * | 10/1993 | Weiss | 250/370.11 |
| 5,406,082 A | * | 4/1995 | Pearson et al. | 250/339.11 |
| 5,444,758 A | * | 8/1995 | Miyake et al. | 378/113 |
| 5,841,533 A | * | 11/1998 | Atkinson | 356/326 |
| 6,180,867 B1 | * | 1/2001 | Hedengren et al. | 136/201 |
| 6,504,903 B1 | * | 1/2003 | Kondo et al. | 378/119 |
| 6,597,430 B1 | * | 7/2003 | Nishi et al. | 355/53 |
| 6,627,914 B1 | * | 9/2003 | Komiyama et al. | 257/29 |
| 6,791,665 B2 | | 9/2004 | Kurt et al. | |
| 6,807,503 B2 | * | 10/2004 | Ye et al. | 702/117 |
| 6,934,017 B2 | * | 8/2005 | Kircher | 356/215 |
| 7,060,350 B2 | * | 6/2006 | Takaya et al. | 428/323 |
| 7,214,528 B1 | * | 5/2007 | Vandenbark et al. | 435/283.1 |
| 2002/0090735 A1 | * | 7/2002 | Kishkovich et al. | 436/111 |
| 2003/0090256 A1 | * | 5/2003 | Kircher | 324/71.1 |

\* cited by examiner

*Primary Examiner*—David A. Vanore
*Assistant Examiner*—Phillip A. Johnston
(74) *Attorney, Agent, or Firm*—Sterne, Kessler, Goldstein & Fox P.L.L.C.

(57) ABSTRACT

An assembly for detection of at least one of radiation flux and contamination on an optical component includes a detector configured to receive at least one of the radiation flux and contamination, and when the assembly is in use, to generate a detector signal correlated to at least one of the radiation flux and contamination on the component. A meter is configured to measure the detector signal. The detector includes at least one wire.

25 Claims, 7 Drawing Sheets

ASSEMBLY FOR DETECTION OF RADIATION FLUX AND CONTAMINATION OF AN OPTICAL COMPONENT, LITHOGRAPHIC APPARATUS INCLUDING SUCH AN ASSEMBLY AND DEVICE MANUFACTURING METHOD

BACKGROUND OF THE INVENTION

1. Field of the Invention

The present invention relates to an assembly for detection of at least one of radiation flux and contamination on an optical component. The present invention also relates to a lithographic apparatus including such an assembly. The present invention also relates to a device manufacturing method.

2. Background of the Invention

Commonly assigned, co-pending U.S. application Ser. No. 10/686,813, filed Oct. 17, 2003, discloses an electrode in the vicinity of an optical component, e.g. a mirror, in a lithographic apparatus. The electrode is biased with a positive potential relative to the optical component. Electrons generated from the optical component by a beam of EUV radiation are transported to the electrode. The current caused by the electrons is measured by a measuring device. This current is correlated to the radiation flux of the beam.

It is desirable to monitor the radiation flux at different locations and/or the contamination on the optical components in a lithographic projection apparatus. When radiation hits a surface it induces secondary electrons. The flux of the secondary electrons thus generated is related to the radiation flux on the surface and/or contamination of the surface. Presently, the secondary electrons are extracted from the surface by an electrode creating an electron attracting electric field and the current through the optical component is measured. In some instances, this measured current may not always yield the correct value for the secondary electron flux. This is caused by the following phenomenon. An photon that hits the surface induces quite an amount of secondary electrons. These electrons form a space charge layer in front of the surface of the optical component for a substantial period of time, since a large flux of secondary electrons is created and since it takes the secondary electrons some time to travel to the electrode. The space charge cloud is located between the surface and the electrode. Newly created secondary electrons are obstructed by this space charge cloud which in a way "screens" the electrode such that less secondary electrons than are generated arrive at the electrode. This may result in an inadequate assessment of the radiation flux.

SUMMARY OF THE INVENTION

It is an aspect of the present invention to provide a device that establishes the correct value of the radiation dose more accurately.

The present invention according to a first embodiment includes a detector including at least one wire. The detector can be placed in an radiation beam without substantially blocking the beam. The wire generates a minimal amount of shadow in the radiation beam. Due to its limited exposure to radiation, heating of the detector is prevented. In addition, the detector makes on-line in-situ measurements possible.

In another embodiment, the present invention includes a meter connected to a memory that stores the detector signal as function of time. This makes it possible to discriminate between short time and long time changes as a function of time. Short time changes will likely be caused by changes in the power of the radiation source supplying the radiation flux. On the other hand, long term changes will most probably be caused by contamination of the optical component.

In yet another embodiment of the present invention, the detector signal is related to a current in the wire and the meter includes a current meter. The current is a reliable measure for the amount of electrons generated, and hence, of the radiation flux. In addition, the electron flux is proportional to the radiation flux up to a much higher maximum radiation flux.

In a further embodiment of the present invention, the assembly is located in the vicinity of the component. In this way, an accurate radiation flux detector is obtained that may also be used to detect contamination of an optical component.

In a still further embodiment of the present invention, the wire is negatively biased. By negatively biasing the wire relative to the surroundings of the wire, the generated secondary electrons are swiftly removed in front of the detector, because the small geometry of the wire results in a high electric field at the surface of the wire. A separate electrode may function as counter electrode to the wire, or the optical component itself may serve as a counter electrode.

In a still further embodiment of the present invention, the wire includes at least one dielectric material and the wire forms a portion of a closed loop connected to a voltage source. Such an installation shows a quick response to incident radiation flux. It is feasible that by choosing different dielectric materials it is possible to distinguish between different contaminants.

In still a further embodiment of the present invention, the wire is at least partly covered with a conducting layer. As an example, for the conducting layer a thin (0.1-100 nm) silicon (Si) layer may be chosen. The silicon oxidizes to silicon dioxide ($SiO_2$). The conductivity of silicon is different from the conductivity of silicon dioxide. As the conducting layer is present on a wire made of a dielectric (i.e. insulating) material, this embodiment has the advantage that the conductivity of the wire is significantly influenced by on changes in the conductivity of the conducting layer. The changes in conductivity relate to the amount of oxidation of the conducting layer.

In still a further embodiment of the present invention, the wire is placed in the vicinity of a radiation source to measure an amount of debris ejected by the radiation source and the wire is connected to a voltage source. This assembly is particularly suited to detect radiation source induced emission of contaminating particles.

In still a further embodiment of the present invention, the wire is located on an optical component. This has the advantage of an accurate measurement with respect to position on an optical component. In addition, the optical component will act as a support. This means that the wire can be much thinner than when the wire is not located on an optical component. Hence, the obstruction of the radiation is less severe.

In a still further embodiment of the present invention, the optical component comprises a multilayer mirror. This allows damage to a layer of a multilayer mirror to be detected early.

In still a further embodiment of the present invention, the wire includes at least one fluorescent portion. In this way, the high energy (e.g., UV or EUV) radiation which may damage a meter may be converted to alternative radiation (or fluorescent). This alternative radiation also may be easier to detect. In addition, since the alternative radiation will be emitted in a random direction, this alternative radiation may be detected with a detector outside the radiation beam.

In still a further embodiment of the present invention, the detector includes a plurality of wires electrically isolated with respect to each other and forming a mesh and, a plurality of meters to measure an individual detector signals, when the assembly is in use, generated by each of the plurality of wires. This provides a radiation flux measurement and contamination detection that are spatially resolved.

In still a further embodiment of the present invention, the voltage source, when the assembly is in use, supplies a voltage in synchronism with the radiation flux. This allows application of a voltage only when required, i.e. during the presence of radiation. Voltages do have an effect on charged particles in the lithographic apparatus. This effect is reduced in this embodiment.

In still a further embodiment of the present invention, at least one wire is at least partly enclosed by a shielding device. This reduces the effect of external influences on the wire.

According to another aspect of the present invention, a lithographic apparatus includes an illumination system configured to provide a projection beam of radiation; a support configured to support a patterning structure, the patterning structure configured to impart the projection beam with a pattern in its cross-section; a substrate table configured to hold a substrate; and a projection system configured to project the patterned beam onto a target portion of the substrate, wherein the lithographic projection apparatus includes an assembly as described above.

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

According to another aspect of the present invention, a device manufacturing method includes projecting a patterned beam of radiation onto a target portion of the substrate, and detecting at least one of radiation flux and contamination of an optical component by generating a signal correlated to at least one of the radiation flux and the contamination and measuring the signal.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. One of ordinary skill will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, i.e. bears the weight of, the patterning structure. It holds the patterning structure in a way depending on the orientation of the patterning structure, the design of the lithographic apparatus, and other conditions, such as for example whether or not the patterning structure is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

In the drawings, corresponding reference symbols indicate corresponding parts.

DETAILED DESCRIPTION

Figure 1:
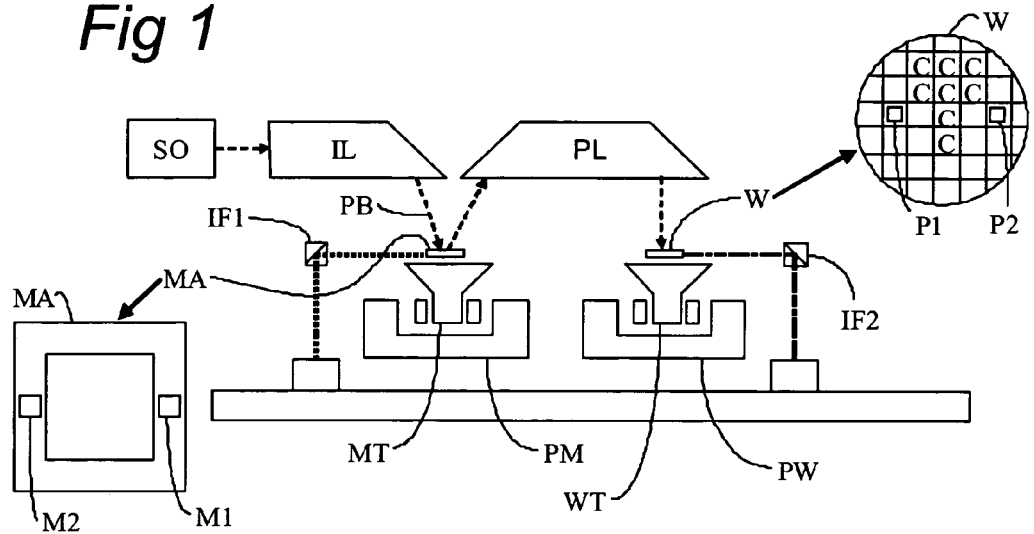
FIG. 1 depicts a lithographic apparatus according to the present invention.

FIG. 1 schematically depicts a lithographic apparatus according to the present invention. The apparatus includes an illumination system (illuminator) IL configured to provide a projection beam PB of radiation (e.g. UV or EUV radiation). A first support (e.g. a mask table) MT is configured to support a patterning structure (e.g. a mask) MA and is connected to a first positioning device PM that accurately positions the patterning structure with respect to a projection system (lens) PL. A substrate table (e.g. a wafer table) WT is configured to hold a substrate (e.g. a resist-coated wafer) W and is connected to a second positioning device PW that accurately positions the substrate with respect to the projection system PL. The projection system (e.g. a reflective projection lens) PL images a pattern imparted to the projection beam PB by the patterning structure MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system. The illuminator IL may comprise an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes a programmable patterning structure, such as a programmable mirror array of a type as referred to above.

Combinations and/or variations on the above described modes of use or entirely different modes of use may also be employed.

Figure 2:
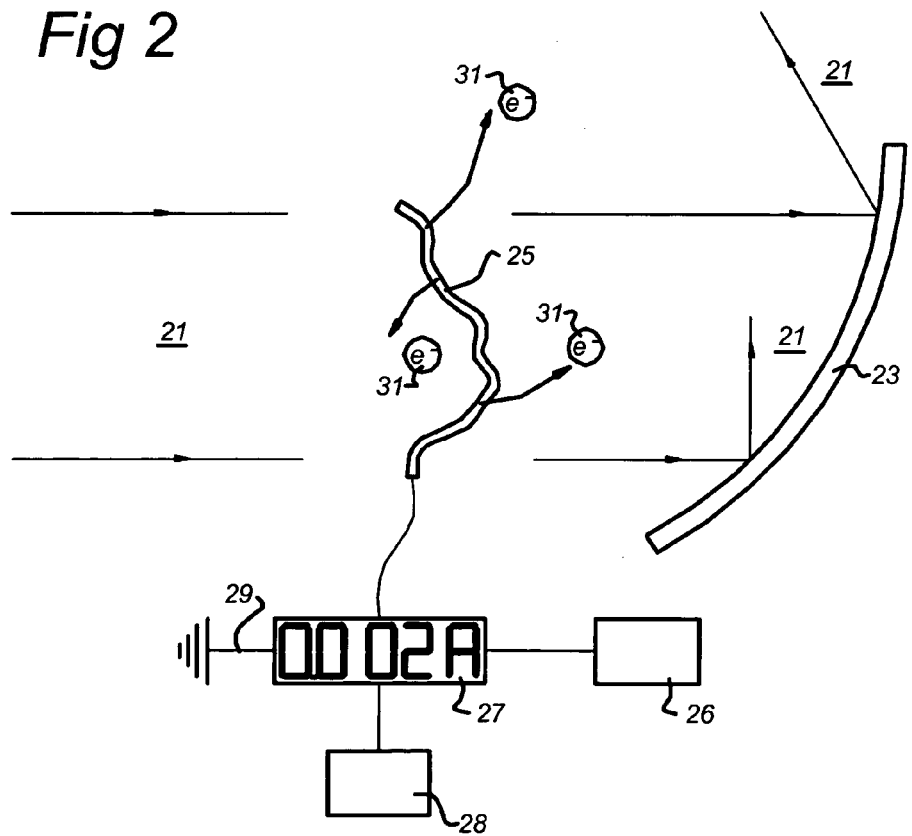
FIG. 2 shows a threadlike radiation flux detector in the vicinity of an optical component.

Referring to FIG. 2, a wire 25 is in a projection beam of radiation 21 (this projection beam is referred to in FIG. 1 with "PB" and is preferably, but not necessarily, EUV radiation). The wire 25 is connected to a current meter 27, which meter is grounded, i.e. connected to earth via a connection 29. A microprocessor unit 26 and a memory 28 for storing the measurements of the meter 27 as a function of time may also be connected to the meter 27. The projection beam of radiation 21 is incident on an optical component 23 such as a mirror. Electrons 31 are ejected from the wire 25.

The projection beam of radiation 21 that hits the wire 25 causes electrons 31 to be ejected from the wire 25. To maintain the neutral state of the wire 25, the ejected electrons 31 are compensated by electrons from ground. These electrons will pass through the connection 29 and through the current meter 27. The current detected by the meter 27 is correlated to the radiation flux on the wire 25 by the microprocessor unit 26. The microprocessor unit 26 converts the current through wire 25 to a radiation flux. As the wire 25 is located close to optical component 23, the radiation flux that is detected by the assembly of the wire 25 and the meter 27 will approximate and be representative for the radiation flux on the optical component 23. The radiation flux detected by the wire 25 can be used to obtain an indication of the contamination of the optical component 23 in the following way. A decrease in the detected radiation flux in time can be observed by use of the memory 28. If, however, it can be established that the radiation flux of the projection beam of radiation 21 is steady, this would indicate contamination of the wire 25. Since the optical component 23 is located in the vicinity of the wire 25, one may then assume that there is contamination on the optical component 23 too. The thin wire (or a mesh/grid of thin wires, as explained in connection with FIG. 9b) only marginally disrupts the projection beam of radiation, i.e. the shadow caused by such a relatively thin object in the projection beam is marginal. The memory 28 enables time dependent measurements.

Figure 3:
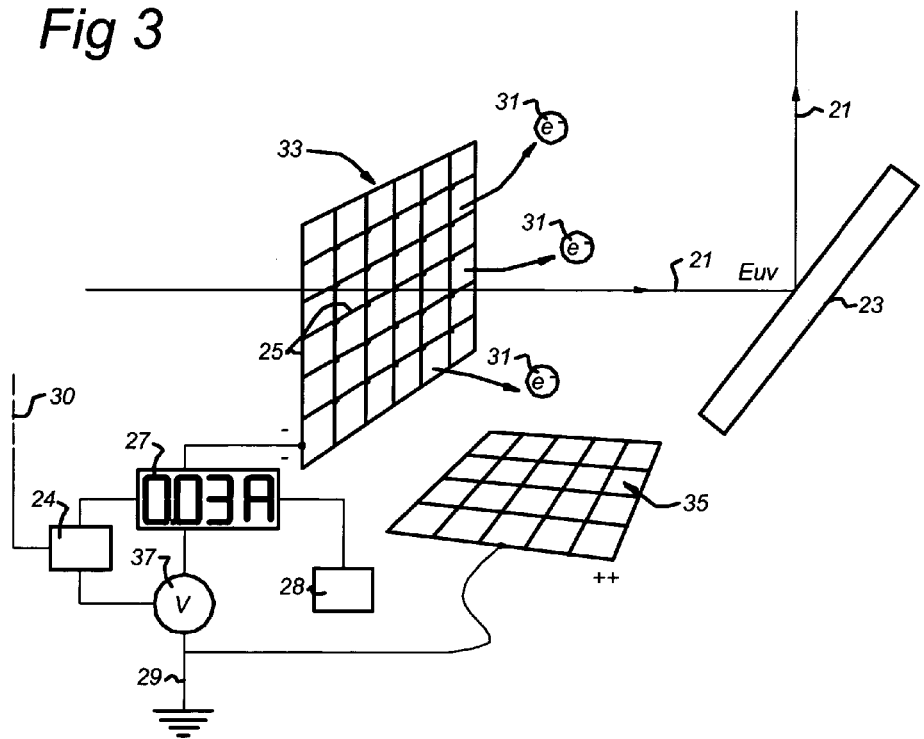
FIG. 3 shows a radiation flux detector with a counter electrode.

Referring to FIG. 3, several wires 25 form a mesh 33. The wires 25 are electrically isolated with respect to each other. A counter electrode (shown in FIG. 3 as, for example, a corresponding mesh) 35 is present, outside the projection beam of radiation 21. The counter electrode 35, however, can have any shape. A voltage source 37 is connected in between the mesh 33 and the counter electrode 35. The voltage source 37 can in principle be connected to all the wires 25 of the mesh 33. In order to measure current through single wires, the wires should be connected to separate current meters. This means that several current meters will be present. In FIG. 3, only one wire is shown connected to the current meter 27. However, it is to be understood, although they are not shown in FIG. 3, that corresponding voltage sources are connected to the other wires 25 forming the mesh 33.

The voltage source 37 induces a negative potential on the wires 25 of the mesh 33 and a positive potential on the counter electrode 35. Negative potential and positive potential are to be understood as negative and positive in relation to each other. It is sufficient that the counter electrode 35 is on a higher potential than (the wires 25 of) the mesh 33. This means that the counter electrode 35 can have a negative, zero or positive voltage. Electrons 31 generated by the projection beam of radiation 21 are transported from the wires 25 to the counter electrode 35 on a positive potential. The mesh 33 has a smaller surface and a correspondingly high electric field at the surface (when a negative voltage with respect to the surroundings is applied). Furthermore, by isolating the wires 25 of the mesh 33 from each other, a spatially resolved measurement of the dose and contamination can be performed. When operating with a radiation source that provides a pulsed projection beam of radiation, it is desirable to provide the difference in voltage by the voltage source 37 on the mesh 33 and the counter electrode 35 in phase with the pulsed projection beam, i.e. only apply the voltage when beam 21 is present and electrons 31 are generated and no voltage when there is no beam 21. To control this synchronization process a controller 24 is connected to the current meter 27 and the voltage source 37. The controller 24 also receives, via a link 30, information about the status (on/off) of the radiation source.

Figure 4:
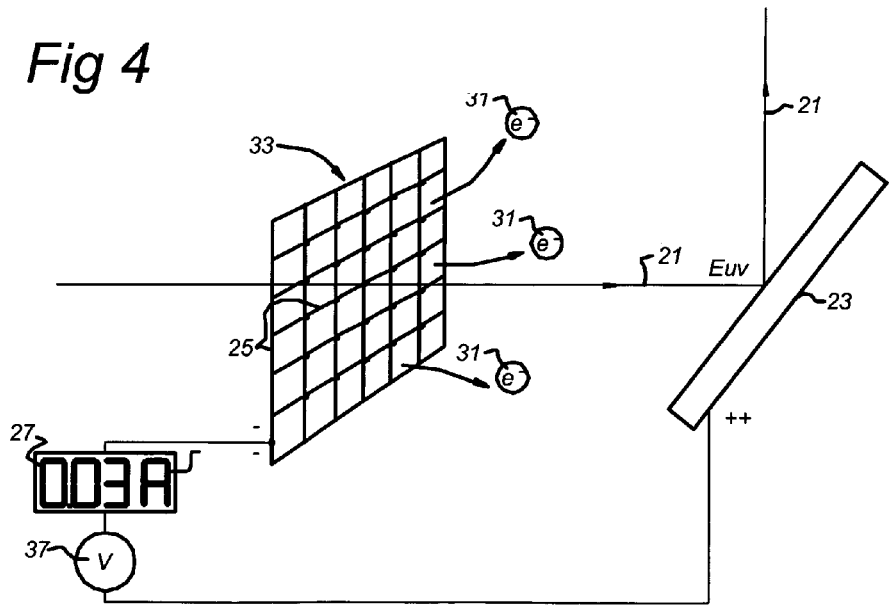
FIG. 4 shows a radiation flux detector with an optical component acting as counter electrode.

Referring to FIG. 4, the function of the counter electrode 35 is taken over by the optical component 23. Although this may lead to a certain amount of contamination of the optical component 23 by electrons, this amount will generally be small as the amount of electrons 31 generated from the mesh 33 will be small due to the effect of the small surface areas of the mesh 33.

Figure 5:
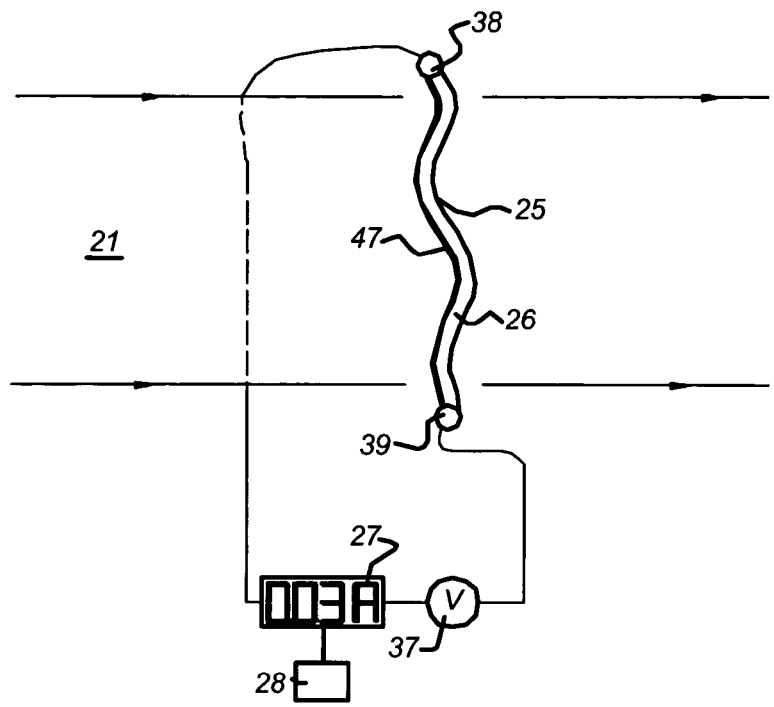
FIG. 5 shows a threadlike radiation flux detector based on the photoelectrical effect.

Referring to FIG. 5, the wire 25 is, at least partly, made of a dielectric material 26 in such a way that the edges of the wire are not electrically connected. The dielectric may be shaped differently than as a wire. At both edges of the wires an electrode 38, 39 is connected to voltage source 37. A non-dielectric material 47 (for instance in the form of a layer) is present on the dielectric material 26 of the wire 25.

As the projection beam of radiation 21 impinges on the non-dielectric material 47, the non-dielectric material 47 can be oxidised. An example of the non-dielectric material 47 is silicon (Si). Upon illumination with radiation, silicon oxidises to $SiO_2$. As the conductivity of the wire 25 is determined by the conductivity of the non-dielectric material 47, the conductivity of the wire changes due to this oxidation process. Therefore, the current through the wire 25 will change as a function of the amount of oxidation of the non-dielectric material 47. Hence, the current as measured by current meter 27 can be related to the oxidation of the non-dielectric material 47. This allows for the determination of oxidation by the projection beam.

Figure 6:
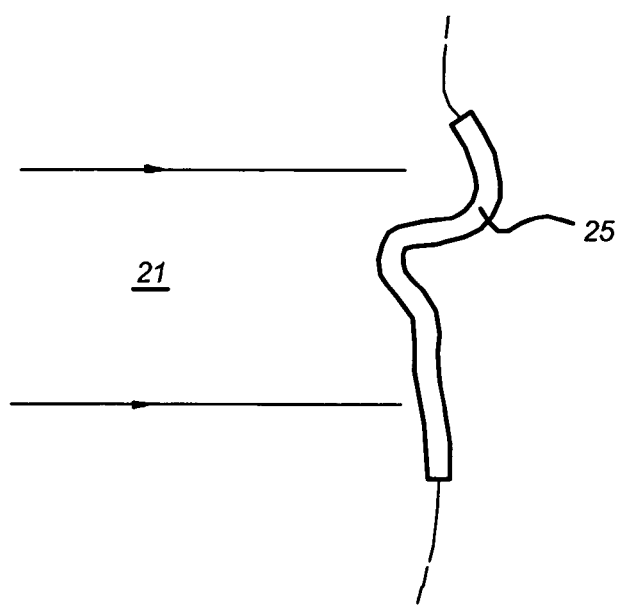
FIG. 6 shows radiation flux/contamination detection based on changes in conductivity.
Figure 7:
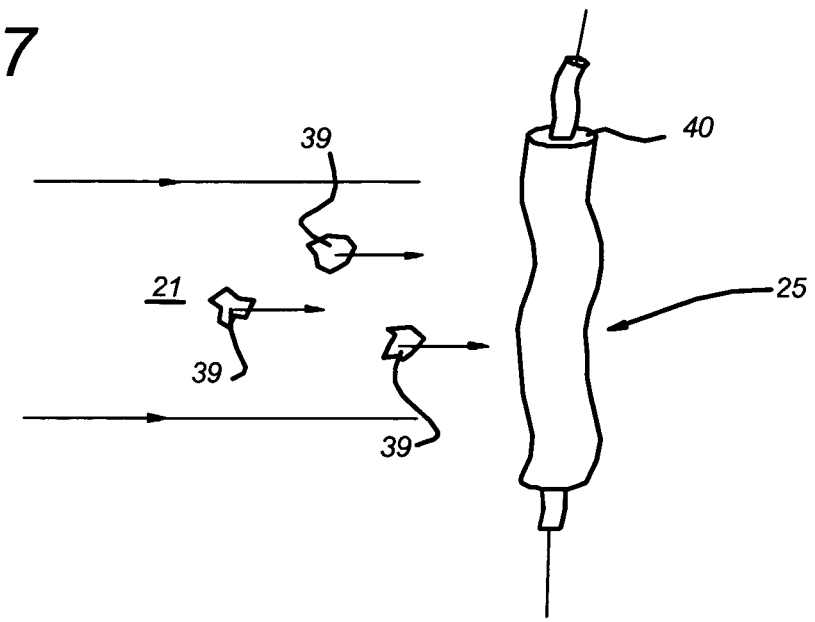
FIG. 7 shows a threadlike radiation flux/contamination detector including an additional layer.
Figure 8:
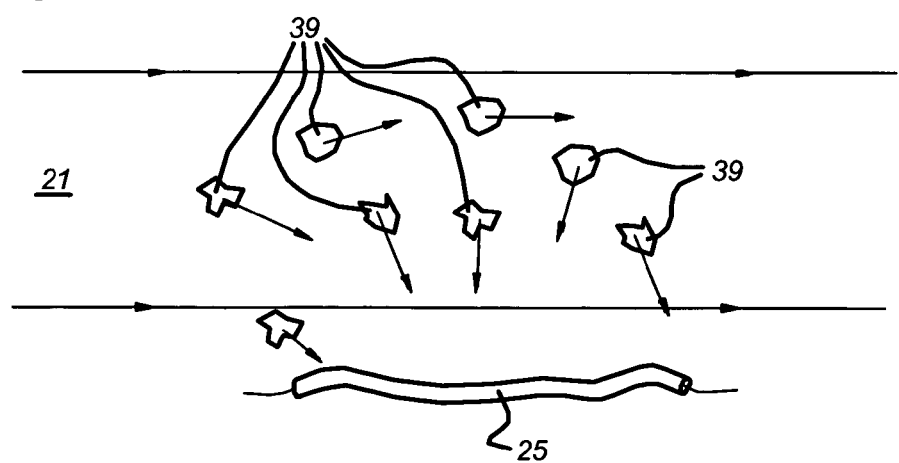
FIG. 8 shows a contamination detector located outside a projection beam of radiation.

Referring to FIG. 6, the wire previously described in FIG. 5 is shown, but without the presence of the non-dielectric material 47. Both terminals of the wire in FIG. 6 and in FIGS. 7 and 8 are connected to an assembly similar to the one described above. The wire 25 in FIG. 6 is at least partly made of dielectric material 26 in such a way that the edges of the wire 25 are not electrically connected.

As the projection beam of radiation 21 impinges on dielectric material 26, the surface of the dielectric material gets conductive. Therefore, a current will be detected by current meter 27. The current produced is a function of the type of radiation, type of dielectric material, and the contamination of the surface of the dielectric material 26. By choosing several wires 25 with different dielectric materials 26 it is possible to discriminate between different contaminants. Examples of dielectric materials are $SiO_2$ and $Al_2O_3$. Other materials with different affinity to different contaminants may be used. This allows for an in-situ contamination determination which distinguishes between contaminants.

Referring to FIG. 7, the insulating wire 25 is covered with a conducting layer 40. During operation, the layer 40 will be etched away by ions 39 in the projection beam of radiation 21 of the lithographic apparatus. This again will change the electrical conductivity of the wire 25 as measured by the assembly, including the current meter 27 and the voltage source 37. The assembly measures the influence of accelerated ions in the lithographic apparatus. When the insulating wire 25 with the conducting layer 40 is placed in the vicinity of the radiation source SO, the assembly measures source induced etching (sputtering).

Referring to FIG. 8, the wire 25 may also be placed near the radiation source SO (in or outside of the projection beam of radiation 21). In this way, the wire will be covered with ions 39, including sputtered electrode material which also will change its electrical conductivity.

Figure 9A:
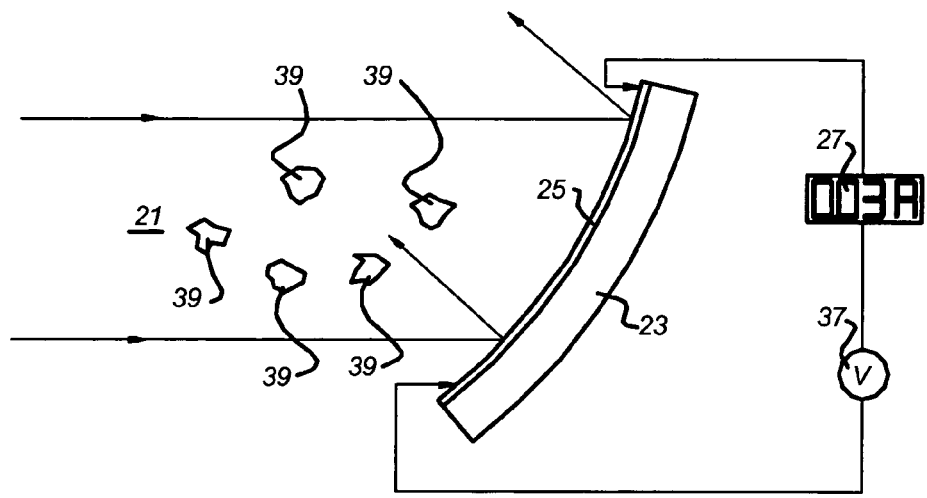
FIG. 9a shows radiation flux/contamination detection on an optical component.

Referring to FIG. 9a, instead of a wire 25 separate from an optical component 23, the optical surface of the optical component 23, such as a mirror, is used for contamination detection. Parts 25 of the mirror 23 function in a way comparable to the wire 25 from the above embodiments (that is why they are referred to with the same reference numeral 25). These parts 25 are connected to a voltage source 37 and the current flowing in these parts 25 is measured by the current meter 27. $SiO_2$ or SiC may be used for the insulating layer.

Figure 9B:
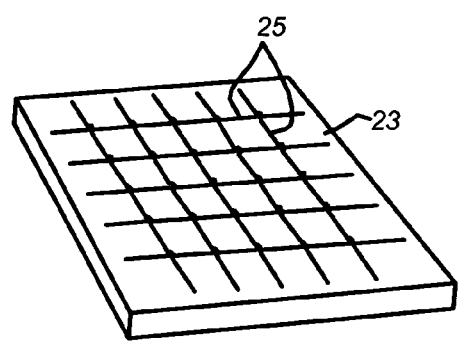
FIG. 9b shows a detector shaped as a grid including a plurality of wires.

FIG. 9b is a front view of the optical component 23 of FIG. 9a. The parts 25 form a network or pattern on the optical component 23. Various different configurations networks, or patterns may be used. Unlike free standing wires, the parts 25 do not have to be as big, since the optical surface acts as support structure for the pattern.

Figure 10:
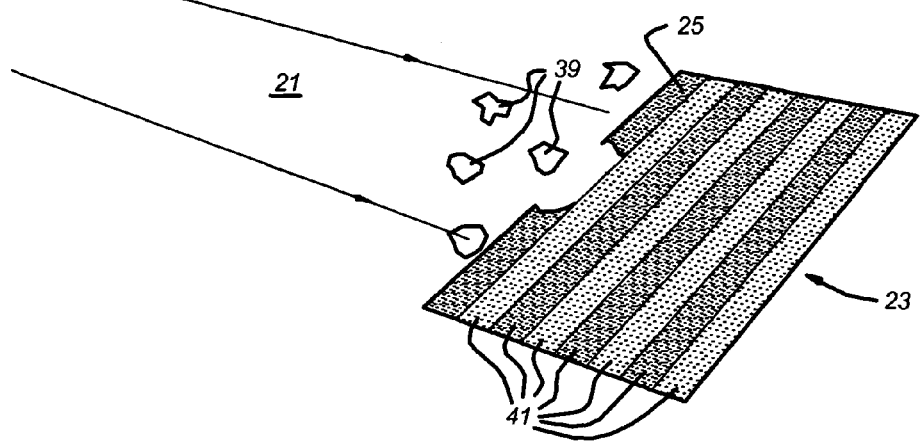
FIG. 10 shows radiation flux/contamination detection on a multilayer optical component.

Referring to FIG. 10, the optical component 23 is a multi-layer mirror comprising several layers 41. The top layer performs a function comparable to the function of the wire 25 described previously, and therefore, is referenced with this same reference numeral. A top layer 25 made of insulating material on the layers 41 may be used for the detection of carbon growth (molecular contamination). With or without the presence of the insulating top layer 25 on the layer 41, the device may be used to detect sputtering of the optical component (multilayer mirror). If the layer 25 is damaged by ions 39, the electrical conductivity will change. Sputtering will also influence conductivity independent of the presence or absence of the layer 25.

Figure 11:
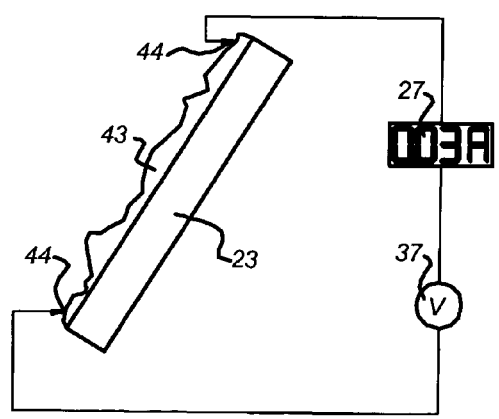
FIG. 11 shows an "off line"/"ex situ" measurement.

Referring to FIG. 11, an optical component 23 with a contaminating layer 43 is shown. Contact with the layer 43 is made via removable contacts 44. These contacts 44 are not present during operation of the lithographic apparatus. This embodiment is used to determine ex-situ, (off-line) the amount of contamination on the optical component 23.

Figure 12:
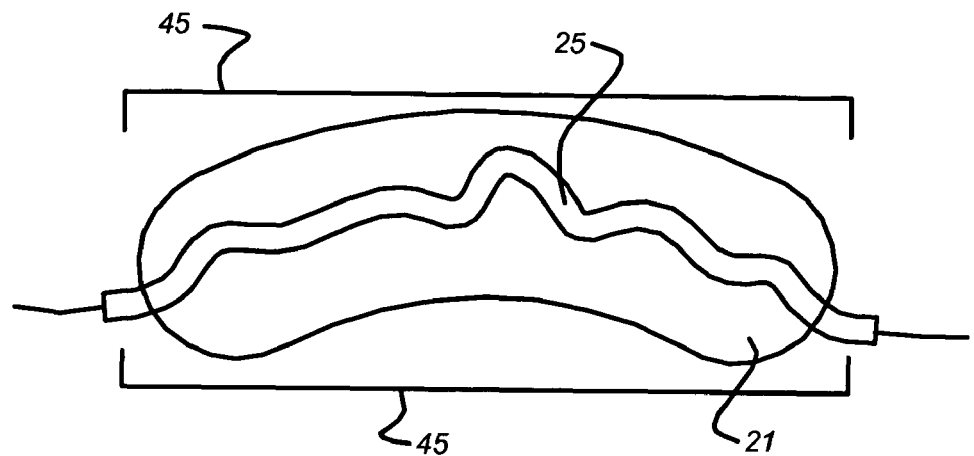
FIG. 12 shows a detector sampling a passing projection beam of radiation.

The arrangement of FIG. 12 is intended to measure radiation flux closely to the reticle level. In FIG. 12, the projection beam of radiation 21 is shown in a cross section. The detection wire 25 is positioned in the projection beam of radiation 21. A screening device 45, such as a shield made of metal, are applied around the wire 25. The inside of the shield is formed of metallic material for conduction reasons. The outside may be of other materials.

The structure of the screening device 45 is such that the influence of external fields (e.g. electrical) is minimized. The wire 25 acts an anode while the screening device 45 acts as a cathode. Additionally and alternatively, a metal shield may be positioned around the complete assembly of anode and cathode. The current generated by the radiation flux is measured by a suitable measurement device. By proper geometrical configuration, it is possible to measure the integral of the radiation flux over the complete cross section of the beam. One function of the shielding device is to minimize electrical fields. In case a magnetic field disturbs the measurement, a magnetic shield may be added.

Figure 13:
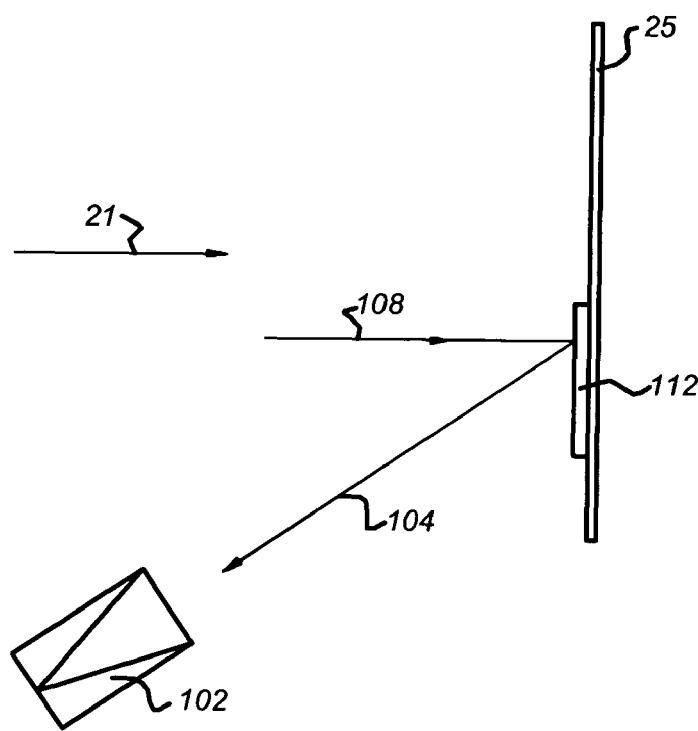
FIG. 13 shows a detector with a fluorescent layer.

Referring to FIG. 13, a part of the surface of the wire 25 includes a layer of fluorescent material 112. The material is sensitive to radiation, for example, EUV radiation. A part 108 of the projection beam 21 will be blocked by the wire 25. A sensor 102 is positioned near the wire, but outside the projection beam 21. The blocked part 108 of projection beam 21 that impinges upon layer 112 of fluorescent material generates light by fluorescence. A portion 104 of that light will impinge upon sensor 102. The sensor 102 measures portion 104 and produces an output signal that is indicative of the intensity of the radiation flux at the position of the wire 25. The sensor 102 may be a photodiode sensitive for visible light. By using fluorescent material, the projection beam profile and intensity can be measured using a relatively simple photodiode. The layer 112 of the wire 25 may, for example comprise compounds like CaS:Ce, YAG:Ce or ZnS:Ag,Al. This arrangement can also be used in a blocking system, such as ReMa blades. Such a blocking system is used in a lithographic apparatus to block off certain parts of the projection beam 21. As the radiation thus blocked would otherwise be lost for further projection purposes, this arrangement may be placed on the blocking system. The blocking system then performs similar to the wire 25.

Although the previous descriptions have been explained in the context a wire, the description are equally applicable for a collections of wires forming a mesh or grid.

While specific embodiments of the invention have been described above, it will be appreciated that the invention may be practiced otherwise than as described. The description is not intended to limit the invention.

What is claimed is:

1. An assembly comprising:
   a detector comprising at least one wire configured to be positioned in a beam of radiation so that electrons are ejected from the at least one wire when the at least one wire is exposed to the beam of radiation, the detector being configured to generate a detector signal correlated to the electrons being ejected from the at least one wire;
   a meter configured to measure the detector signal;
   a memory coupled to the meter; and
   a processing device coupled to the meter and the memory, wherein the processing device is programmed to store the detector signal in the memory as a function of time and as an indication of contamination.

2. An assembly according to claim 1, wherein the detector signal is related to a current in the at least one wire and the meter comprises a current meter.

3. An assembly according to claim 1, wherein the assembly is located in a vicinity of an optical component.

4. An assembly according to claim 1, wherein the at least one wire is negatively biased.

5. An assembly according to claim 1, wherein the at least one wire comprises at least one dielectric material and a portion of a closed loop connected to a voltage source.

6. An assembly according to claim 5, wherein the voltage source is configured to supply a voltage in synchronism with the radiation flux.

7. An assembly according to claim 1, wherein the at least one wire comprises an electrically conducting material and a portion of a closed loop connected to a voltage source.

8. An assembly according to claim 7, wherein the voltage source is configured to supply a voltage in synchronism with the radiation flux.

9. An assembly according to claim 5, wherein the at least one wire is at least partly covered with a conducting layer.

10. An assembly according to claim 5, wherein the at least one dielectric material comprises Al2O3 and/or SiO2.

11. An assembly according to claim 9, wherein the conducting layer comprises Si.

12. An assembly according to claim 1, wherein the at least one wire is placed in the vicinity of a radiation source in order to measure an amount of debris ejected by the radiation source and the at least one wire is connected to a voltage source.

13. An assembly according to claim 1, wherein the at least one wire is located on an optical component.

14. An assembly according to claim 13, wherein the optical component comprises a multilayer minor.

15. An assembly according to claim 1, wherein the at least one wire comprises at least one fluorescent portion.

16. An assembly according to claim 1, wherein the detector comprises a plurality of wires electrically isolated with respect to each other and form a mesh, and wherein the assembly further comprises a plurality of meters configured to measure individual detector signals generated by each of the plurality of wires.

17. An assembly according to claim 12, wherein the voltage source is configured to supply a voltage in synchronism with the radiation flux.

18. An assembly according to claim 1, wherein the at least one wire is at least partly enclosed by a shielding device.

19. An assembly according to claim 18, wherein the shielding device is configured to shield the at least one wire from an electrical field and/or a magnetic field.

20. A lithographic apparatus, comprising:
   an illumination system configured to provide a beam of radiation;
   a support configured to support a patterning structure, the patterning structure configured to impart the beam of radiation with a pattern in its cross-section;
   a substrate table configured to hold a substrate;
   a projection system configured to project the patterned beam onto a target portion of the substrate; and
   an assembly for determining a radiation flux, the assembly comprising:
   a detector comprising at least one wire configured to be positioned in the beam of radiation so that electrons are ejected from the at least one wire when the at least one wire is exposed to the beam of radiation, the detector being configured to generate a detector signal correlated to the electrons being ejected from the at least one wire;
   a meter configured to measure the detector signal;
   a memory coupled to the meter; and
   a processing device coupled to the meter and the memory, wherein the processing device is programmed to store the detector signal in the memory as a function of time and as an indication of contamination.

21. A device manufacturing method, comprising:
   positioning at least one wire in a beam of radiation so that electrons are ejected from the at least one wire when the at least one wire is exposed to the beam of radiation;
   patterning the beam of radiation;
   projecting the patterned beam of radiation onto a target portion of a substrate;
   generating a signal correlated to the electrons being ejected from the at least one wire;
   measuring the signal with a meter; and
   storing, using a programmed processing device, in a memory the measured signal as a function of time, wherein the stored measured signal is an indication of contamination.

22. An assembly according to claim 1, wherein the beam of radiation comprises EUV radiation.

23. A lithographic apparatus according to claim 20, wherein the beam of radiation comprises EUV radiation.

24. A device manufacturing method according to claim 21, wherein the beam of radiation comprises EUV radiation.

25. A method, comprising:
   positioning at least one wire in a beam of radiation so that electrons are ejected from the at least one wire when the at least one wire is exposed to the beam of radiation;
   generating a signal correlated to the electrons being ejected from the at least one wire;
   measuring the signal with a meter; and
   storing, using a programmed processing device, in a memory the measured signal as a function of time, wherein the stored measured signal is an indication of contamination.

* * * * *